United States Patent [19]
Takamatsu et al.

[11] Patent Number: 5,514,215
[45] Date of Patent: May 7, 1996

[54] TREATING LIQUID SUPPLYING APPARATUS FOR A SUBSTRATE SPIN TREATING APPARATUS

[75] Inventors: Kazuhisa Takamatsu; Akihiro Hisai; Hiroshi Kato; Masami Ohtani, all of Kyoto, Japan

[73] Assignee: Dainippon Screen Mfg. Co., Ltd., Japan

[21] Appl. No.: 220,915

[22] Filed: Mar. 30, 1994

[30] Foreign Application Priority Data

Mar. 30, 1993 [JP] Japan .................... 5-096697

[51] Int. Cl.⁶ .................... B05B 7/06; B05B 13/02
[52] U.S. Cl. .................... 118/313; 118/319; 118/321; 427/422; 427/426; 222/402.23
[58] Field of Search .................... 118/313, 319, 118/320, 321, 52; 427/426, 422; 222/420, 402.23

[56] References Cited

U.S. PATENT DOCUMENTS

| | | | |
|---|---|---|---|
| 4,457,259 | 7/1984 | Samuels | 118/705 |
| 4,790,262 | 12/1988 | Nakagama et al. | 118/52 |
| 5,002,008 | 3/1991 | Ushijima et al. | 118/313 |
| 5,094,884 | 3/1992 | Hillman et al. | 427/240 |
| 5,171,393 | 12/1992 | Muffat | 156/345 |
| 5,234,499 | 8/1993 | Sasaki et al. | 118/52 |

FOREIGN PATENT DOCUMENTS

| | | |
|---|---|---|
| 2132444 | of 1990 | Japan . |
| 452990 | of 1992 | Japan . |

Primary Examiner—Timothy M. McMahon
Assistant Examiner—N. Bhat
Attorney, Agent, or Firm—Ostrolenk, Faber, Gerb & Soffen

[57] ABSTRACT

A plurality of nozzles and treating liquid supplying tubes are supported by rigid support arms forming part of temperature control piping for contacting the tubes to maintain treating liquids in the tubes to a constant temperature. The support arms are pivotable about a pivot axis located sideways from a substrate, such that the nozzles are movable between a dispensing position and a standby position displaced from above the substrate. A drive arm engages and swings a selected one of the support arms to move the nozzle attached to the selected support arm, between the dispensing position and standby position. With this construction, a nozzle selected from the plurality of nozzles is reliably moved in a predetermined posture to a predetermined position, while allowing sufficient temperature control of treating liquids by the temperature controlling piping, and avoiding inadvertent dripping of the treating liquids due to deformations of the treating liquid supplying tubes.

15 Claims, 8 Drawing Sheets

TREATING LIQUID SUPPLYING APPARATUS FOR A SUBSTRATE SPIN TREATING APPARATUS

BACKGROUND OF THE INVENTION (1) Field of the Invention

The present invention relates to a treating liquid supplying apparatus for a substrate spin treating apparatus for supplying photoresist or other surface treating liquids to substrates, such as semiconductor wafers, glass substrates for photomasks, glass substrates for liquid crystal displays or substrates for optical disks, to effect a surface treatment thereof. Specifically, such a treating liquid supplying apparatus has a plurality of nozzles for supplying the treating liquids to a substrate supported for a spinning motion, a plurality of tubes for connecting the nozzles to treating liquid storages, temperature control piping for contacting the tubes to maintain the treating liquids therein at a constant temperature, and a nozzle moving device for moving a selected one of the nozzles to a dispensing position above the substrate under treatment.

(2) Description of the Related Art

With this type of spin treating apparatus, it is desired that a plurality of treating liquid supplying systems be provided for one such apparatus in order selectively to supply plural types of treating liquids having different components or different degrees of viscosity. For this purpose, a known apparatus, as disclosed in Japanese Utility Model Publication No. 4-52990, for example, includes a transfer arm for gripping and moving a selected one of a plurality of nozzles arranged in a standby position to a dispensing position above a substrate.

The known apparatus, however, has the following drawbacks:

(1) When the transfer arm grips and moves one of the nozzles, the hardness of a tube connected to this nozzle imparts a resistance to vary a nozzle posture. Such a resistance places the nozzle in an unsteady dispensing posture upon arrival at the dispensing position above the substrate, e.g. displaced from the predetermined dispensing position, or tilted instead of facing directly downward. As a result, the nozzle applies the treating liquid to inappropriate regions of the substrate. Generally, precision in the order of 0.1 mm is required for positions of the substrate to which the treating liquid is applied, in order to effect a uniform treatment. Such misapplication of the treating liquid results in a low quality treatment.

(2) The tube connecting each nozzle to its treating liquid source is displaced to a large extent when the nozzle is moved between standby position and dispensing position. Consequently, where the treating liquid supplying tube extends through temperature control piping for maintaining the treating liquid at a constant temperature, it is difficult to make a piping arrangement because of the rigidity of such a multiple pipe structure.

Conversely, where such temperature control piping is formed of a thin, flexible material to give priority to the piping arrangement, a temperature controlling fluid may flow through the pipes only in an insufficient quantity. Then, the treating liquid supplying tubes cannot receive a uniform temperature control peripherally thereof, which results in a reduced precision of temperature control.

(3) The tube is subjected to a considerable bending and twisting deformation, resulting in volume variations within the pipe. With such volume variations, the treating liquid tends to fall in large drops from the nozzle to the substrate.

SUMMARY OF THE INVENTION

A primary object of the present invention is to provide a treating liquid supplying apparatus for reliably moving a selected one of a plurality of nozzles in a predetermined posture to a predetermined position, while allowing sufficient temperature control of treating liquids by means of temperature control piping, and avoiding inadvertent dripping of the treating liquids due to deformations of treating liquid supplying tubes.

It is also an object of the invention to move a selected one of the nozzles without entailing impurities or particles of dust to substrates.

Other objects of the invention will be apparent from the preferred embodiments described hereinafter.

The above objects are fulfilled, according to the present invention, by a treating liquid supplying apparatus for a substrate spin treating apparatus comprising a plurality of nozzles each for supplying a treating liquid to a substrate supported for a spinning motion; a plurality of tubes for connecting the nozzles to respective treating liquid storages, otherwise known as supplies or reservoirs; temperature control piping for contacting the tubes to maintain the treating liquids in the tubes to a constant temperature; and a nozzle moving device for selecting and moving one of the nozzles to a dispensing position above the substrate; wherein sets of one nozzle and one tube each are supported by rigid support arms, respectively; the nozzle moving device including an arm support device for supporting each of the support arms to be pivotable about a pivot axis displaced from above the nozzles, such that a selected one of the nozzles is movable between the dispensing position and a standby position displaced from above the substrate; and an arm swing device for selectively engaging and swinging the support arms to move the selected nozzle between the dispensing position and the standby position.

In the treating liquid supplying apparatus according to the present invention, each set of one nozzle and one tube is supported by an individual rigid support arm, and the arm swing device is operated to engage the support arm supporting a desired set of nozzle and tube. When the arm swing device causes the support arm to pivot about the pivot axis established by the arm support device, the desired nozzle supported by the above support arm moves to a predetermined position.

Thus, the movement of the nozzle is controlled to be a pivotal movement about the pivotal axis established by the arm support device, with a distance of the nozzle from the pivot axis established by the support arm. As a result, a selected nozzle may be moved accurately to a predetermined position through a pivotal movement having a fixed center and radius.

Since this support arm supports a tube as well as a nozzle, forces resulting from any deformation of the tube during the movement are received by the support arm, without being applied to the nozzle. Consequently, there arises no possibility of the nozzle being subjected to an unsteady posture or deviating from a treating liquid dripping position.

As noted above, each set of one nozzle and one tube is supported by a support arm, and the arm swing device is operated to engage the support arm supporting a desired set of nozzle and tube. The desired nozzle is moved to the predetermined position through a pivotal movement about the pivot axis established by the arm support device. Thus, the movement of the nozzle is a controlled movement having a fixed center and radius, which assures an accurate transfer of the nozzle to the predetermined position. Further, since the support arm supports a tube as well as a nozzle, forces resulting from any deformation of the tube during the movement are received by the support arm, without being applied to the nozzle. This enables the nozzle to move to the predetermined dispensing position reliably in a predetermined posture, to enhance treating precision.

Moreover, the feature that a selected support arm is swung about a predetermined pivot axis imposes little restriction to the piping arrangement. The treating liquid supplying tubes and the temperature control piping for contacting the tubes may have thicknesses as desired and may be formed of a wide variety of materials, thereby to effect excellent temperature control for the treating liquids.

The deformation of the tubes resulting from pivotal movement of the support arms is limited to a twisting deformation about the pivot axis. Compared with the prior construction in which the tubes undergo both bending and twisting deformations, less volume variations take place inside the tubes according to the present invention. This is effective to avoid inadvertent dripping of the treating liquids due to such deformation of the treating liquid supplying tubes.

In another aspect of the invention, the foregoing objects are fulfilled by a treating liquid supplying apparatus for a substrate spin treating apparatus comprising a plurality of nozzles each for supplying a treating liquid to a substrate supported for a spinning motion; a plurality of tubes for connecting the nozzles to treating liquid storages, respectively; temperature control piping for contacting the tubes to maintain the treating liquids in the tubes to a constant temperature; and a nozzle moving device for selecting and moving one of the nozzles to a dispensing position above the substrate; wherein sets of one nozzle and one tube each are supported by rigid support arms, respectively; the nozzle moving device including arm swing supports for pivotally supporting the support arms, respectively; an arm selecting and moving device for moving a selected one of the arm swing supports to a predetermined position located sideways from the substrate; an aligning and engaging device for engaging the selected support arm moved to the predetermined position by the arm selecting and moving device, to render the selected support arm pivotable about a pivot axis displaced from above the nozzles; and an arm swing device for engaging and swinging the selected support arm aligned by the aligning and engaging device, to move the nozzle supported by the selected support arm between the dispensing position and a standby position displaced from above the substrate.

According to this treating liquid supplying apparatus, each set of one nozzle and one tube is supported by a support arm, and the arm selecting and moving device is operable to move the support arm supporting a desired set of nozzle and tube to a predetermined position located sideways from the substrate. After the aligning and engaging device establishes a pivot axis, the arm swing device is placed in engagement with this support arm. Then the arm swing device is operated to swing the support arm about the pivot axis established by the aligning and engaging device. As a result, the nozzle supported by this support arm moves to a predetermined position.

Thus, the movement of the nozzle is controlled to be a pivotal movement about the pivotal axis established by the aligning and engaging device, with a distance of the nozzle from the pivot axis established by the support arm. As a result, a selected nozzle may be moved accurately to a predetermined position through a pivotal movement having a fixed center and radius.

Since this support arm supports a tube as well as a nozzle, forces resulting from any deformation of the tube during the movement are received by the support arm, without being applied to the nozzle. Consequently, there arises no possibility of the nozzle being subjected to an unsteady posture or deviating from a treating liquid dripping position.

As in the preceding treating liquid supplying apparatus according to the present invention, the nozzle may be moved to the predetermined dispensing position reliably in a predetermined posture to enhance treating precision. In the second aspect of the invention, excellent temperature control may also be effected for the treating liquids, while avoiding inadvertent dripping of the treating liquids due to deformation of the treating liquid supplying tubes.

In addition, the arm swing device engages a selected support arm in the position located sideways from the substrate, i.e. displaced from above the substrate, and swings the support arm between the dispensing position and standby position. As a result, the nozzle is moved without entailing impurities or particles of dust to the substrate. This assures a still higher level treating quality.

In a further aspect of the invention, the foregoing objects are fulfilled by a treating liquid supplying apparatus for a substrate spin treating apparatus comprising a plurality of nozzles each for supplying a treating liquid to a substrate supported for a spinning motion; a plurality of tubes for connecting the nozzles to treating liquid storages, respectively; temperature control piping for contacting the tube to maintain the treating liquids in the tubes to a constant temperature; and a nozzle moving device for selecting and moving one of the nozzles to a dispensing position above the substrate; wherein sets of one nozzle and one tube each are supported by rigid support arms, respectively; the nozzle moving device including arm swing supports for supporting the support arms to be pivotable about different predetermined pivot axes located sideways from the substrates, respectively; an arm selecting device movable from one of the support arms to another to engage a selected support arm; and an arm swing device for swinging the selected support arm engaged by the arm selecting device in a position displaced sideways from the substrate, to move the nozzle supported by the selected support arm between the dispensing position and a standby position displaced from above the substrate.

According to this treating liquid supplying apparatus, each set of one nozzle and one tube is supported by a support arm, and a plurality of such support arms are in turn supported by the arm swing supports to be pivotable about different pivot axes located sideways from the substrate, respectively. The arm selecting device is operable to engage the support arm supporting a desired set of nozzle and tube and to swing this support arm about the pivot axis established by the arm swing support. As a result, the nozzle supported by this support arm moves to a predetermined position.

Thus, the movement of the nozzle is controlled to be a pivotal movement about the pivotal axis established by the arm swing support, with a distance of the nozzle from the pivot axis established by the support arm. As a result, a selected nozzle may be moved accurately to a predetermined position through a pivotal movement having a fixed center and radius.

Since this support arm supports a tube as well as a nozzle, forces resulting from any deformation of the tube during the movement are received by the support arm, without being applied to the nozzle. Consequently, there arises no possibility of the nozzle being subjected to an unsteady posture or deviating from a treating liquid dripping position.

As in the preceding treating liquid supplying apparatus according to the present invention, the nozzle may be moved to the predetermined dispensing position reliably in a predetermined posture to enhance treating precision. In the third aspect of the invention, excellent temperature control may also be effected for the treating liquids, while avoiding inadvertent dripping of the treating liquids due to deformation of the treating liquid supplying tubes.

In addition, the arm selecting device engages the selected support arm in the position located sideways from the substrate, i.e. displaced from above the substrate, and swings the support arm between the dispensing position and standby position. As a result, the nozzle is moved without entailing impurities or particles of dust to the substrate. This assures a still higher level treating quality.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DETAILED DESCRIPTION OF THE PREFERRED EMBODIMENTS

Figure 1:
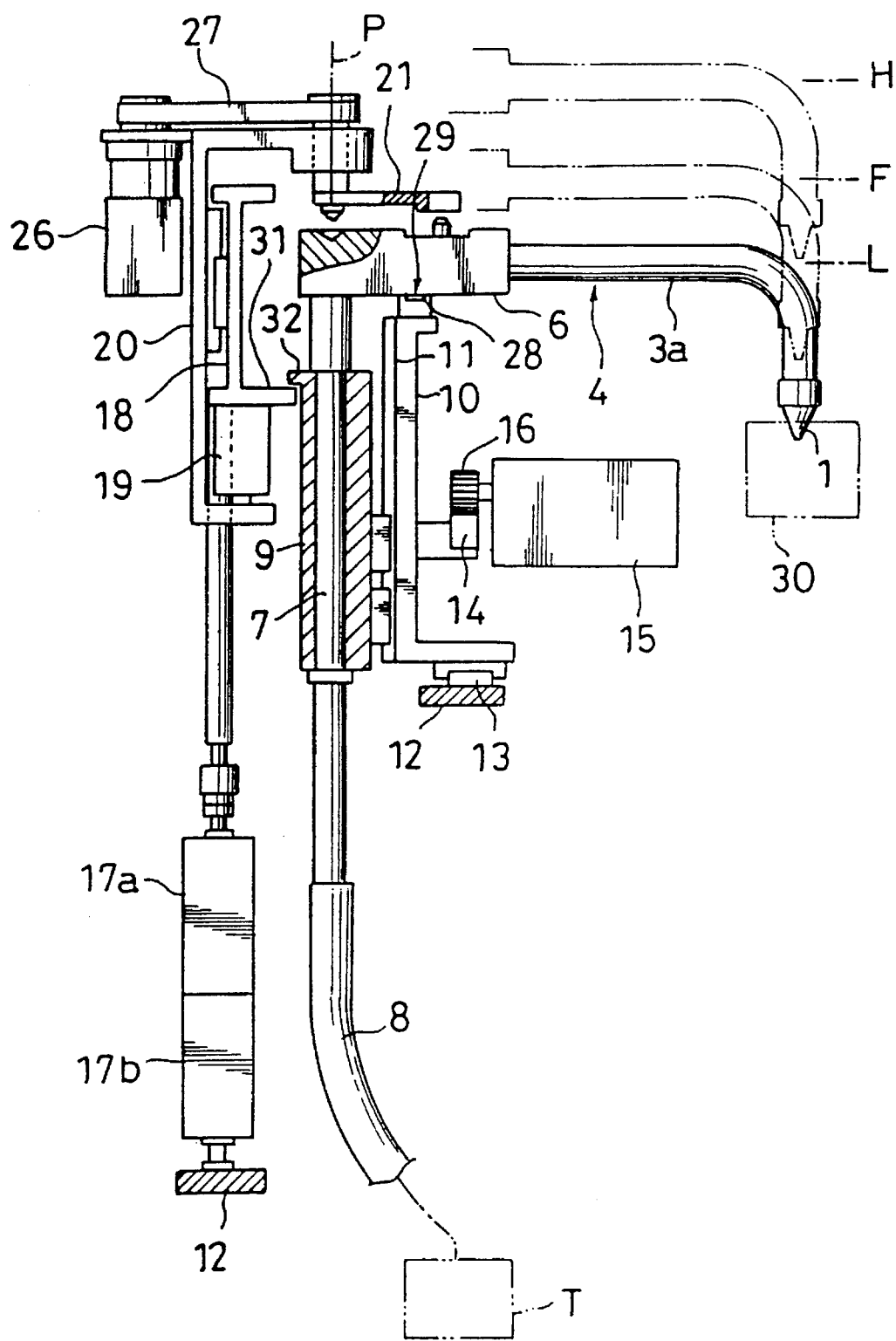
FIG. 1 is a side view, partly in section, of a first embodiment of the invention.

Preferred embodiments of the present invention will be described hereinafter with reference to the drawings. The first embodiment (FIGS. 1–5) of treating liquid supplying apparatus constructed according to this invention includes a plurality of nozzles 1 each for supplying a photoresist solution, which is one example of treating liquids, to a semiconductor wafer W (FIG. 2) supported for a spinning motion. Each nozzle 1 is connected to a treating liquid storage T through a tube 2 (FIG. 3). The tube 2 is covered by temperature control piping 3 for circulating constant temperature water to maintain the treating liquid in the tube 2 at a constant temperature. The apparatus further includes a nozzle moving mechanism for moving a selected one of the nozzles 1 between a dispensing position adjacent and above the center of spinning of wafer W, and a standby position retracted from above the wafer W.

Each nozzle 1 is attached to a distal end of a highly rigid metal pipe 3a acting as part of the temperature control piping 3, with a forward portion of the tube 2 supported in the metal pipe 3a. The metal pipe 3a houses a return tube 5 as well. The constant temperature water supplied to the interior of the metal pipe 3a is recovered through the return tube 5 after heating the treating liquid in the tube 2 to the constant temperature. The constant temperature water may flow in a direction opposite to the above, i.e. may be supplied through the return tube 5 to the interior of the temperature control piping 3.

The metal pipe 3a is rigidly attached at a proximal end thereof to a support block 6, and a tubular shaft 7 formed of metal is secured to one end of the support block 6. The metal pipe 3a, support block 6 and tubular shaft 7 constitute a rigid support arm 4 for supporting the nozzle 1 and tube 2. The temperature control piping 3 includes the metal pipe 3a, support block 6, tubular shaft 7 and return tube 5. A constant temperature water supply tube 8 is connected to a lower end of the tubular shaft 7 to form part of the temperature control piping 3. The treating liquid supply tube 2 and return tube 5 extend through the constant temperature water supply tube 8. This water supply tube 8 is connected to a constant temperature water source not shown.

The tubular shaft 7 of each support arm 4 is supported by an arm swinging support 9 to be rotatable about the axis of the tubular shaft 7. This and other arm swinging supports 9 are juxtaposed in a direction perpendicular to the plane of FIG. 1 and supported by a common movable frame 10 to be vertically slidable along respective guide rails 11.

The movable frame 10 is supported by a stationary frame 12 of the substrate spin treating apparatus to be movable horizontally along a guide rail 13. The movable frame 10 carries a rack 14 meshed with a pinion 16 driven by an electric motor 15 rotatable in both directions. Thus, the arm swinging supports 9 are movable along the direction perpendicular to the plane of FIG. 1 by the electric motor 15 being rotated in both the directions.

A lift frame 18 is disposed laterally of the arm swinging supports 9 to be vertically movable by a pair of air cylinders 17a and 17b in series connection. The lift frame 18 includes a movable bracket 20 vertically movable by an air cylinder 19. The movable bracket 20 includes a support shaft 21a mounted in an upper portion thereof to be rotatable about a pivot axis P located in a predetermined position. A drive arm 21 is attached to a lower end of the support shaft 21a to be pivotable about the pivot axis P.

The support block 6 of each support arm 4 has a conical engaging recess 22 formed in an upper surface thereof and located on the axis of the tubular shaft 7. The support block 6 also has an engaging pin 23 projecting from a position thereof spaced from the recess 22 toward the nozzle 1.

On the other hand, the drive arm 21 has a conical engaging projection 24 formed on a lower surface thereof and located on the pivot axis P, and an engaging bore 25 spaced from the pivot axis P and opposed to the engaging pin 23. A selected one of the support arms 4 is movable by an arm selecting and moving mechanism including the movable frame 10 and electric motor 15, to a predetermined position to place the axis of the tubular shaft 7 directly under the pivot axis P of the drive arm 21. When one of the support arms 4 is moved to this position, the drive arm 21 is lowered to have engaging projection 24 and engaging bore 25 of the drive arm 21 engage with the engaging recess 22 and engaging pin 23 of the support arm 4, respectively. Thus, an engaging and aligning mechanism is provided to position and maintain the drive arm 21 and support arm 4 in a firmly engaged state, with the axis of the tubular shaft 7 aligned to the pivot axis P of the drive arm 21. The construction for engaging the engaging projection 24 and engaging bore 25 of the drive arm 21 with the engaging recess 22 and engaging pin 23 of the support arm 4, respectively, to maintain the drive arm 21 and support arm 4 in the firmly engaged state is called herein an engaging mechanism.

The support shaft 21a supporting the drive arm 21 is operatively connected through a timing belt 27 to an electric motor 26 secured to the movable bracket 20 and rotatable in both directions. Thus, an arm swing mechanism is provided to swing, with the electric motor 26 being rotated in both the directions, the support arm 4 engaged with the drive arm 21 as noted above, about the pivot axis P set to the predetermined position. Consequently, the nozzle 1 on this support arm 4 is moved between the standby position displaced sideways or outboard from the wafer W and the dispensing position adjacent the center of the wafer W.

An operation of the foregoing construction for supplying the treating liquid will be described next.

Figure 2:
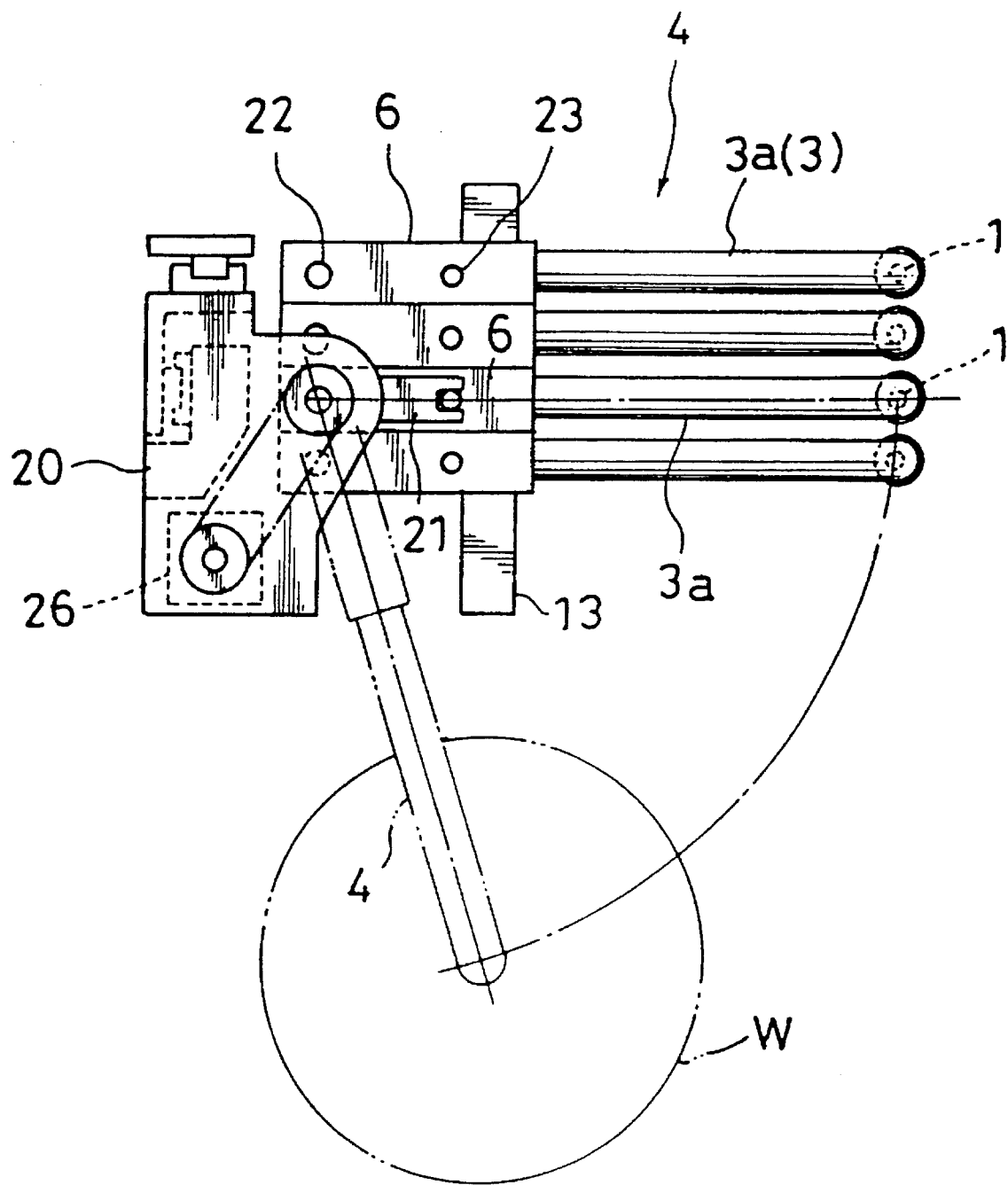
FIG. 2 is a plan view of the first embodiment.
Figure 3:
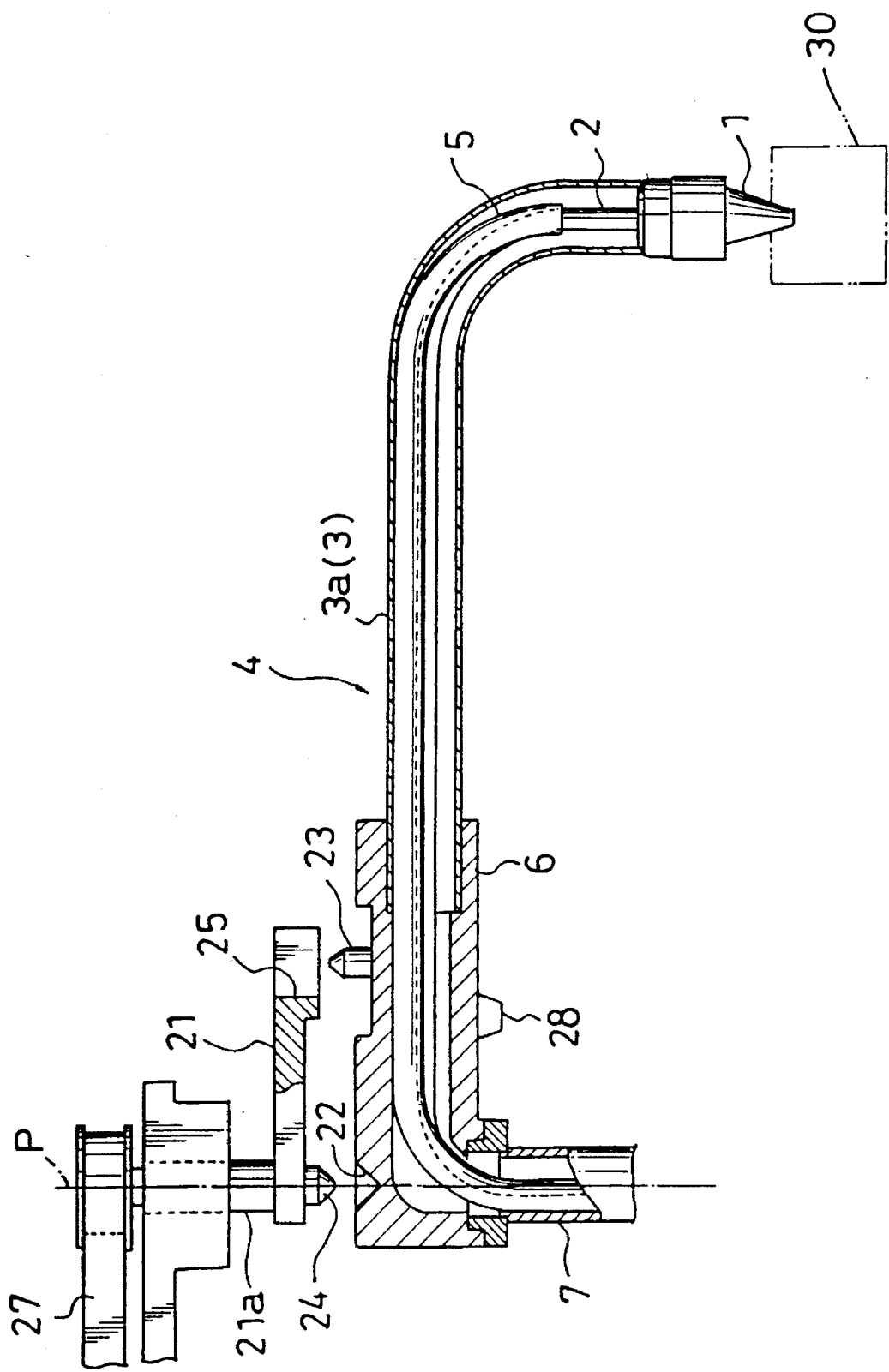
FIG. 3 is a side view, partly in section, of a principal portion of the first embodiment.

(1) In an initial state, as shown in solid lines in FIGS. 1 and 2, all the nozzles 1 are retracted to the standby position displaced sideways or outboard from the wafer W, with the arm swinging supports 9 standing by in a lower position (L). Each arm swinging support 9 in the lower position (L) is set to a predetermined posture through engagement between a positioning projection 28 formed on a lower surface of the support block 6 and a positioning recess 29 formed in an upper surface of the movable frame 10.

In this standby state, each nozzle 1 is dipped in a wet atmosphere contained in a fixed anti-drying cup 30.

(2) For supplying the treating liquid, the electric motor 15 is operated first to drive the movable frame 10, whereby the support arm 4 of a selected nozzle 1 is brought to a position under the pivot axis P or drive arm 21.

Figure 4:
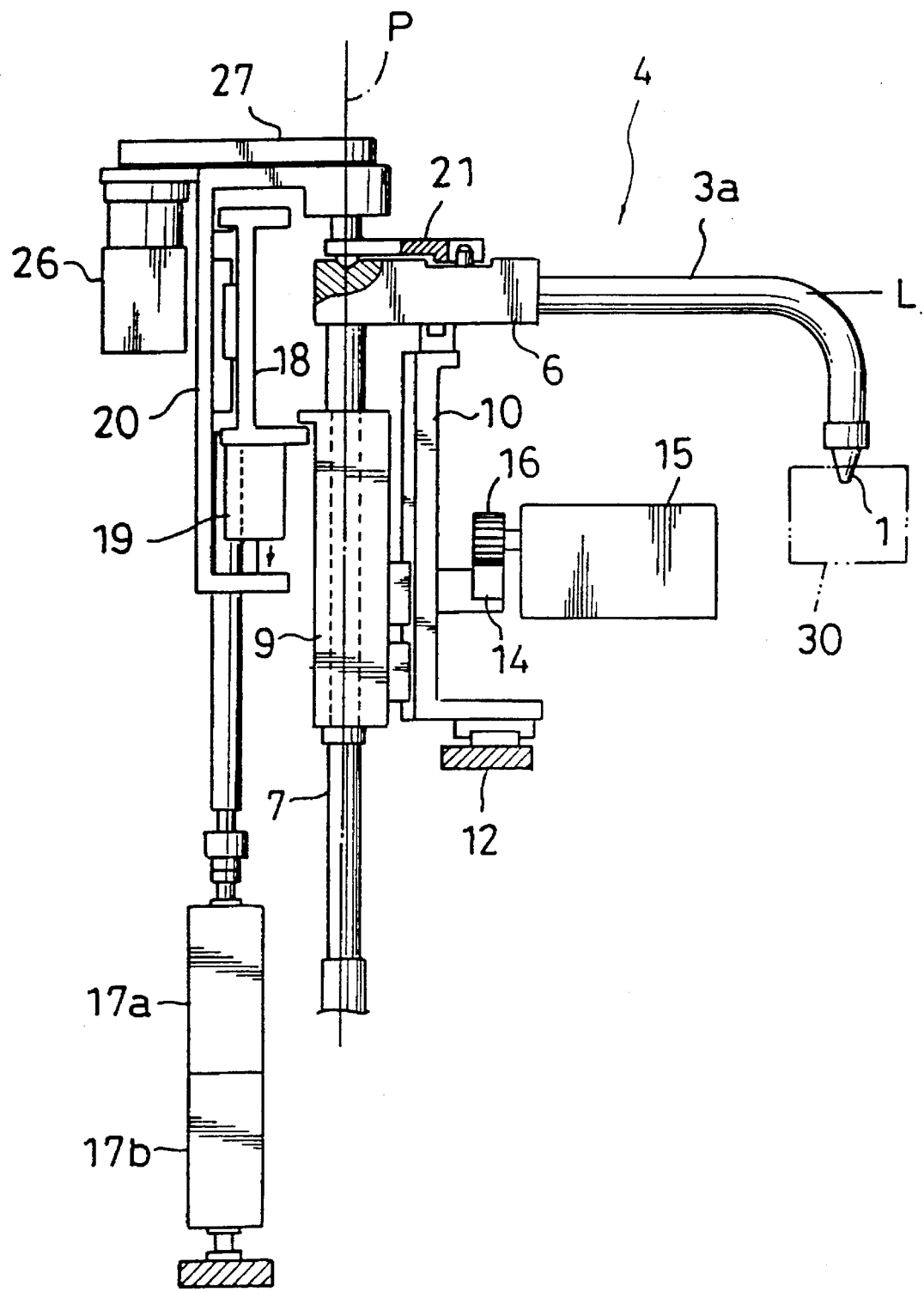
FIG. 4 is a side view, partly in section, of the first embodiment with a support arm placed in an engaged position.

(3) Next, as shown in FIG. 4 which is a partly sectional side view, the air cylinder 19 is extended to lower the movable bracket 20, thereby lowering the drive arm 21 into engagement with the support arm 4. Consequently, the tubular shaft 7, about which the support arm 4 is pivotable to move the selected nozzle 1 to the dispensing position above the wafer W, is aligned to the pivot axis P of the drive arm 21.

Figure 5:
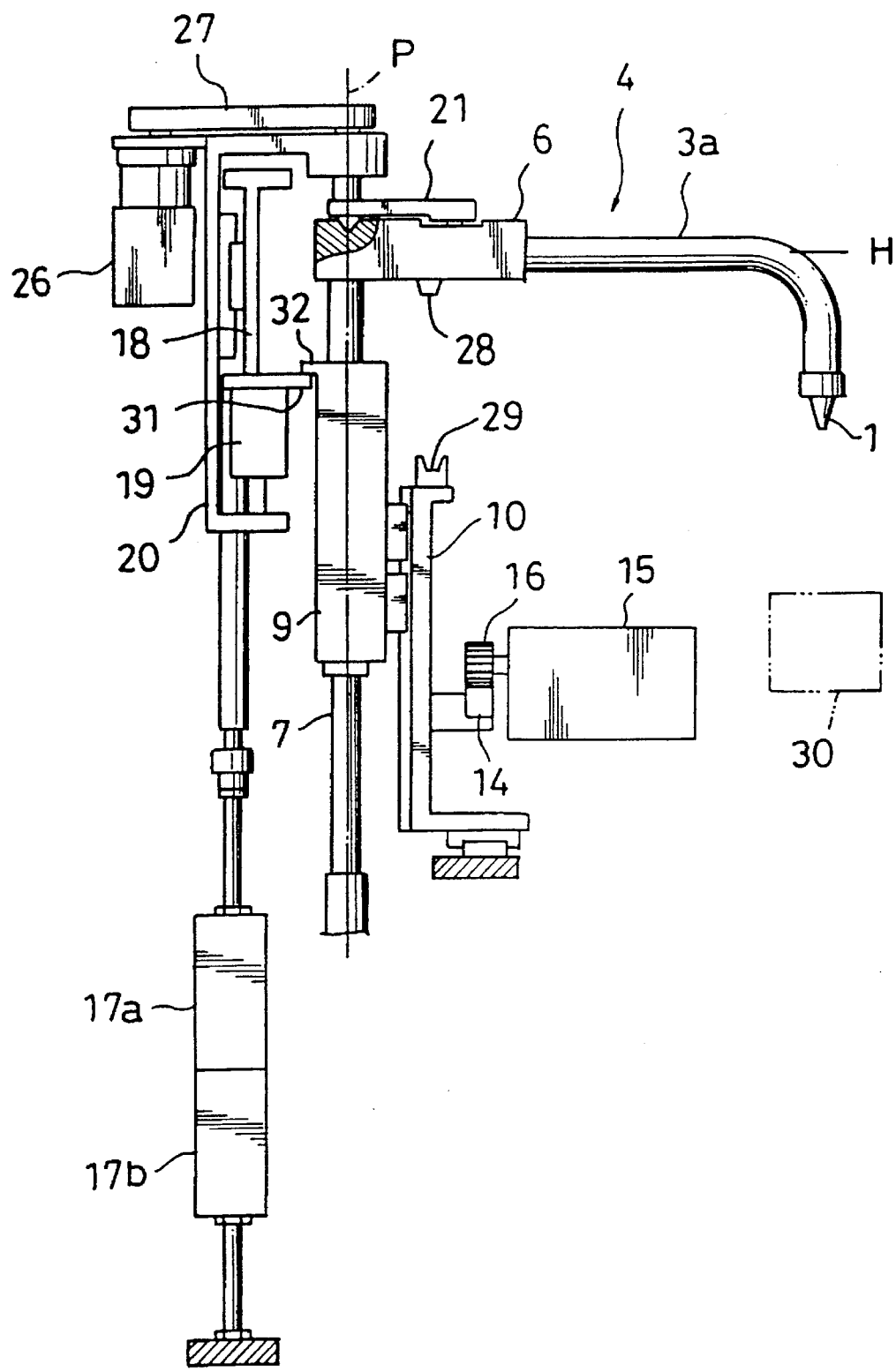
FIG. 5 is a side view, partly in section, of the first embodiment with the support arm placed in a raised position.

(4) Subsequently, the air cylinders 17a and 17b are both extended (FIG. 5) to raise the lift frame 18. In an early stage of this ascent, a contact portion 31 of the lift frame 18 moves up against a lug 32 projecting from an upper end of the arm swinging support 9. As a result, the support arm 4 is vertically clamped between the drive arm 21 and the contact portion 31 of the lift frame 18. In the clamping state, the lift frame 18 is raised further to raise both the support arm 4 and arm swinging support 9 to an upper limit (H) as shown in FIG. 5.

(5) Next, the electric motor 26 is rotated forward, causing the drive arm 21 to pivot a predetermined angle clockwise in FIG. 2, thereby to swing the nozzle 1 to the predetermined dispensing position above the wafer W.

(6) Then, one of the air cylinders 17a and 17b is contracted to lower the nozzle 1 to a predetermined liquid feeding level (F) over the wafer W. In this state, a predetermined quantity of treating liquid is allowed to drip onto the wafer W prior to a spin or while wafer W has started spinning at low speed. Immediately thereafter, the wafer W is spun at high speed so that the treating liquid may be spread uniformly thereon.

(7) Upon completion of the treating liquid supplying step, the contracted air cylinder is extended again to retract the support arm 4 and nozzle 1 up to the predetermined height (H) over the wafer W. Then, the electric motor 26 is rotated backward to swing the support arm 4 back to the standby position. With the support arm 4 now lying in the standby position, both the air cylinders 17a and 17b are contracted to lower the lift frame 18 to its lower limit. The air cylinder 19 also is contracted to raise the movable bracket 20 and drive arm 21, thereby disengaging the drive arm 21 from the support arm 4. For using a different one of nozzles 1, the movable frame 10 is suitably driven to select a corresponding support arm 4 for engagement with the drive arm 21, which is followed by the above sequence of operation.

Figure 6:
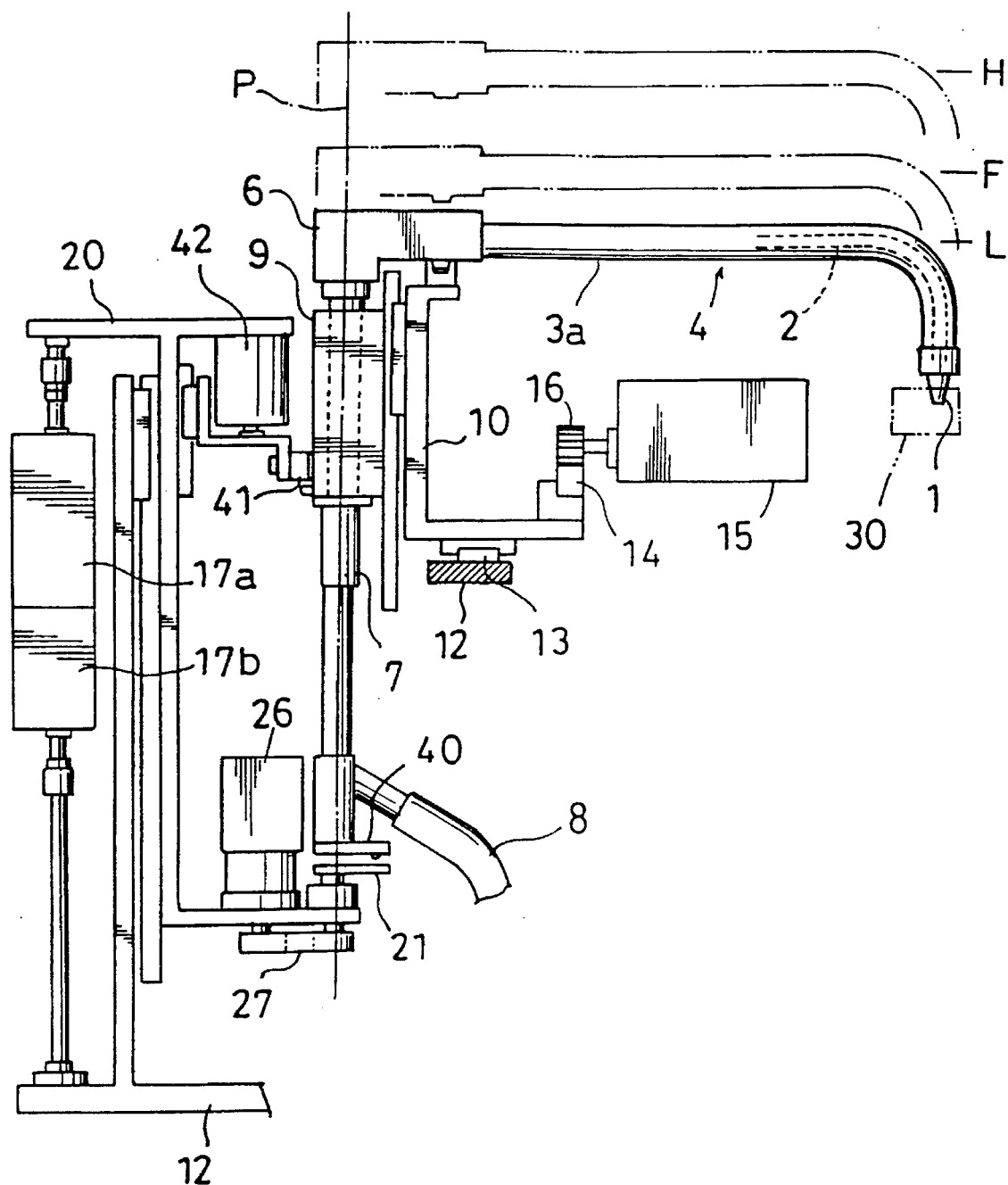
FIG. 6 is a side view, partly in section, of a second embodiment of the invention.

FIG. 6 is a side view showing a treating liquid supplying apparatus for a substrate spin treating apparatus in a second embodiment of the invention. This embodiment differs from the first embodiment as follows.

In this embodiment, a connecting arm 40 is attached to a lower end of the tubular shaft 7 of each support arm 4, and this connecting arm 40 is engageable with a drive arm 21 for alignment. The tubular shaft 7 is clamped by the drive arm 21 and a contact element 41 independently driven up and down by an air cylinder 42 mounted on a lift frame 20. The other aspects are the same as in the first embodiments, and like reference numerals are used to identify like parts which will not be described again.

Figure 7:
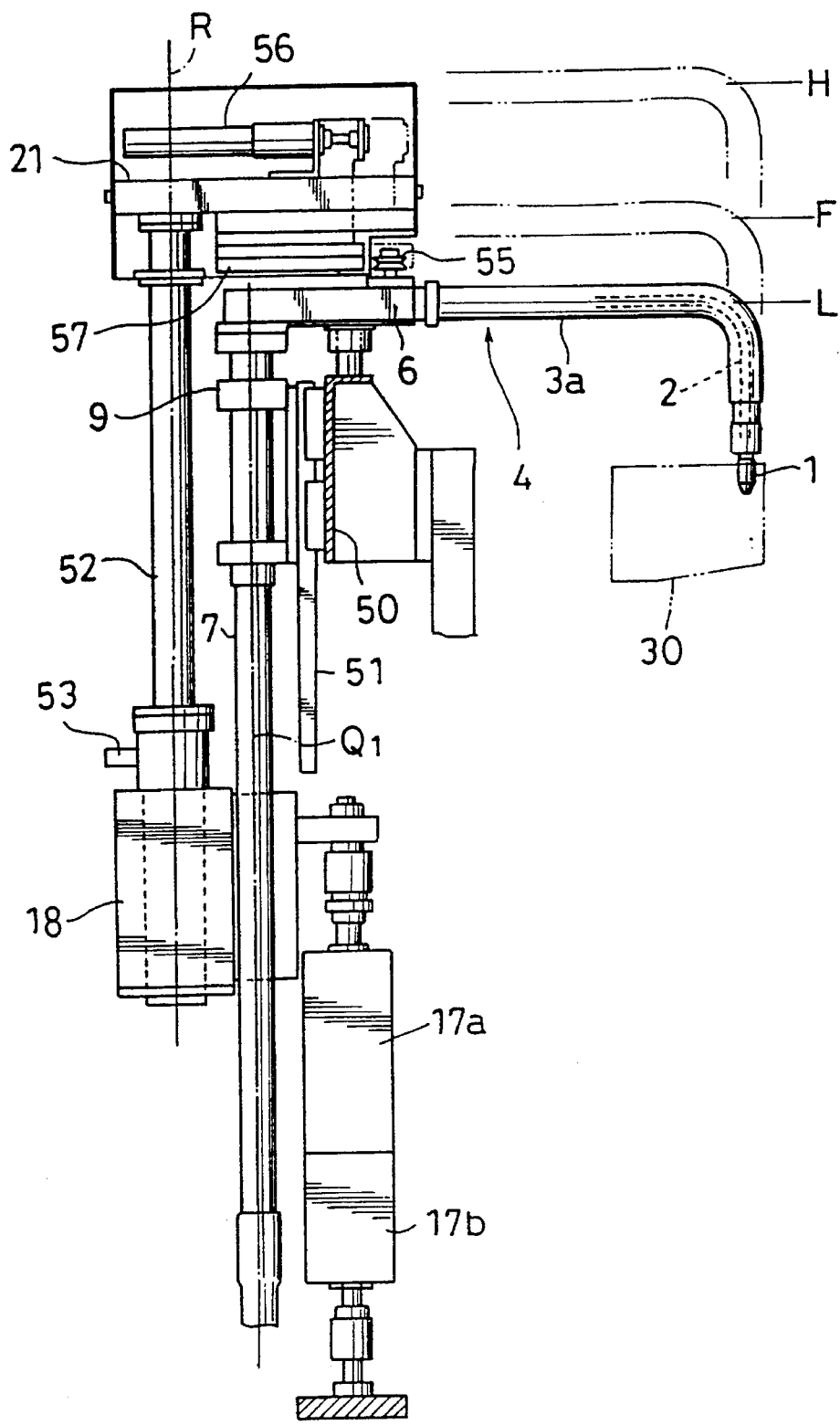
FIG. 7 is a side view, partly in section, of a third embodiment of the invention.
Figure 8:
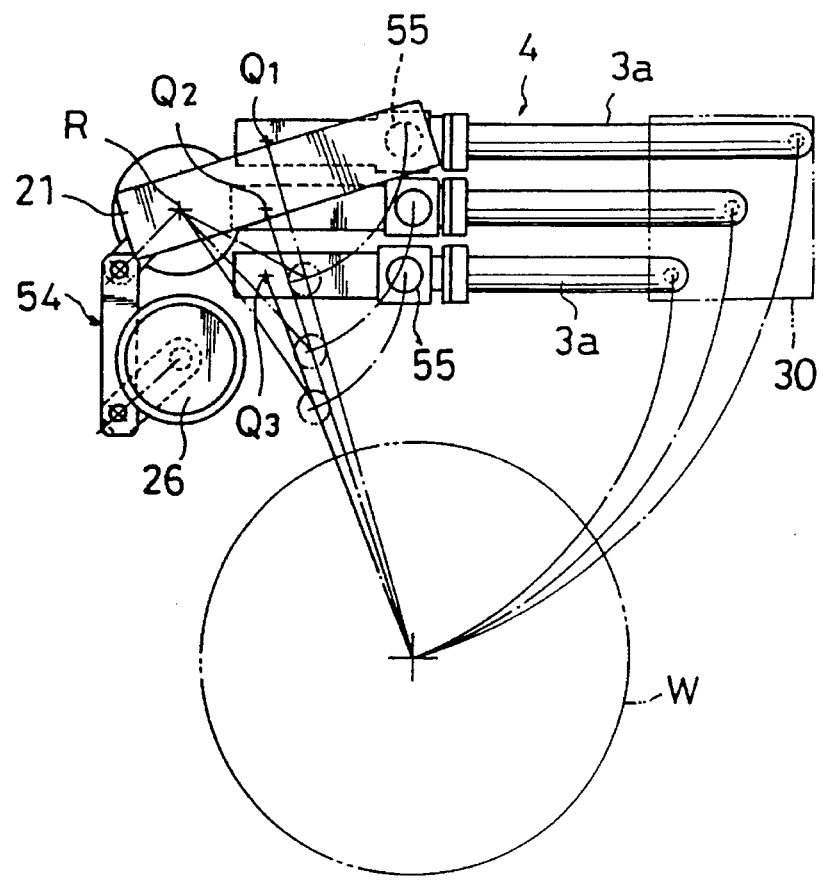
FIG. 8 is a plan view of the third embodiment.
Figure 9:
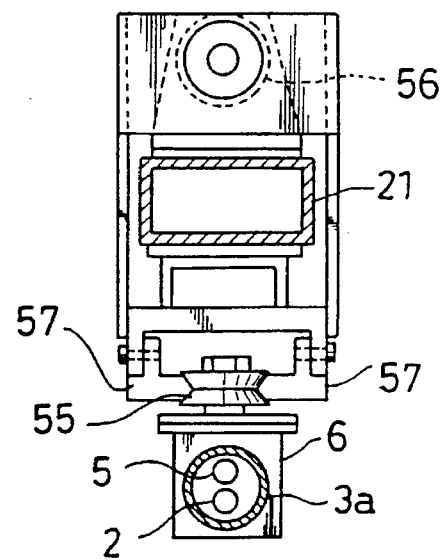
FIG. 9 is a sectional view of a principal portion of the third embodiment.

FIGS. 7–9 illustrate an embodiment of treating liquid supplying apparatus according to this invention for a substrate spin treating apparatus. This third embodiment differs from the first embodiment in the following aspects.

In this embodiment, a plurality of support arms 4 each supporting a nozzle 1 and a tube 2 are juxtaposed to be pivotable about pivot axes Q1, Q2 and Q3 set to different predetermined positions, respectively. Each support arm 4 is connected at a proximal end thereof to a tubular shaft 7 rotatably supported in an arm swinging support 9. The support 9 is supported by an apparatus frame 50 to be vertically movable along a guide rail 51. A drive arm 21 is disposed laterally of these support arms 4 to be pivotable about a predetermined axis R for selecting a nozzle 1 to be used.

Each support arm 4 is pivotable about the pivot axis Q1, Q2 or Q3 extending vertically, such that a length from its pivot axis Q1, Q2 or Q3 to the nozzle 1, in plan view, equals a distance between the pivot axis Q1, Q2 or Q3 and the center of wafer W or the treating liquid dispensing position of the nozzle 1.

The drive arm 21 is connected at a proximal end thereof to a support shaft 52 supported by a lift frame 18 to be rotatable about the axis R. The lift frame 18 is vertically movable by a pair of air cylinders 17a and 17b in series connection. An arm 53 extending from the support shaft 52 is operatively connected through a linkage 54 to an electric motor 26 mounted on the lift frame 18 and rotatable in both directions. By the electric motor 26 being rotated in both the directions, the drive arm 21 is movable over and traversing the plurality of support arms 4.

A V-groove roller 55 is mounted adjacent and above the proximal end of each support arm 4 to be rotatable about a vertical axis. The drive arm 21 has a pair of right and left guide rails 57 mounted on a lower surface thereof to be extendible and retractable longitudinally of the drive arm 21 by an air cylinder 56. The roller 55 is engageable with the guide rails 57 when the latter are extended forward and cooperate therewith to constitute a lost motion driving connection between drive arm 21 and the selected support arm. The other aspects are the same as in the first embodiments, and like reference numerals are used to identify like parts which will not be described again.

The third embodiment is operable as follows:

(1) The drive arm 21 is swung over the support arms 4 standing by in the lower position (L) to select the support arm 4 of a nozzle 1 to be used. The guide rails 57 are advanced to engage and support the roller 55 of the selected support arm 4.

(2) Both of the air cylinders 17a and 17b are extended to raise the lift frame 18 and move the selected support arm 4 to the upper limit (H).

(3) Next, the drive arm 21 is swung to move the nozzle 1 on the engaged support arm 4 to the dispensing position over the wafer W. At this time, the difference in the center of pivotal movement between the support arm 4 and drive arm 21 is absorbed by a relative movement between the guide rails 57 and roller 55.

(4) Subsequently, one of the air cylinders 17a is contracted to lower the support arm 4 a predetermined amount, thereby to set the support arm 4 to a predetermined liquid feeding height (F) relative to the wafer W.

In the first to third embodiments described hereinbefore, each metal pipe 3a forming part of the temperature control piping 3 is used also as part of the support arm 4 for supporting the nozzle 1 and tube 2. Thus, the tube 2 is enclosed in the metal pipe 3a, i.e. in the support arm 4. Instead of this construction, a support arm may be provided separately from the temperature control piping 3 and exclusively for supporting the nozzle 1 and tube 2.

The present invention may be embodied in other specific forms without departing from the spirit or essential attributes thereof and, accordingly, reference should be made to the appended claims, rather than to the foregoing specification, as indicating the scope of the invention.

What is claimed is:

1. Apparatus for applying treating liquid to a substrate which is supported for a spinning motion by substrate spin treating equipment, said apparatus comprising:

a plurality of nozzles each for supplying a treating liquid to a substrate supported for a spinning motion;

a plurality of tubes each for connecting an individual one of said nozzles to a supply of treating liquid;

temperature control piping for contacting said tubes to maintain treating liquid in said tubes at a constant temperature; and a common nozzle moving device for selecting and moving each of the nozzles one at a time to a dispensing position, with the nozzle that is moved to said dispensing position being disposed to dispense a treating liquid that impinges upon a substrate disposed below and vertically aligned with said dispensing position;

a plurality of rigid support arms each supporting an individual set, each of said sets comprising an individual one of said nozzles and an individual one of said tubes through which treating liquid is supplied to said one of said nozzles;

said common nozzle moving device comprising a transport unit for supporting each of said support arms to be swingable about an axis displaced horizontally from said nozzles, such that a selected one of said nozzles is movable by said moving device between said dispensing position and a standby position displaced outboard of said substrate, and for selectively engaging and swinging said support arms one at a time to move the nozzle supported by the support arm so selectively engaged between said dispensing position and said standby position.

2. Apparatus as defined in claim 1, wherein said transport unit comprising:

arm support means for supporting each of said support arms to be swingable about said axis displaced from above said nozzles, such that a selected one of said nozzles is movable between said dispensing position and a standby position outboard of a substrate positioned for treatment;

an arm swing for selectively engaging and swinging said support arms to move the selected nozzle between said dispensing position and said standby position.

3. Apparatus for applying treating liquid to a substrate which is supported for a spinning motion by substrate spin treating equipment, said apparatus comprising:

a plurality of nozzles each for supplying a treating liquid to a substrate supported for a spinning motion;

a plurality of tubes each for connecting an individual one of said nozzles to a supply of treating liquid;

temperature control piping for contacting said tubes to maintain treating liquids in said tubes at a constant temperature; and a common nozzle moving unit for selecting and moving each of the nozzles one at a time to a dispensing position, with the nozzle that is moved to said dispensing position being disposed to dispense a treating liquid that impinges upon a substrate disposed below and vertically aligned with said dispensing position;

a plurality of rigid support arms each supporting an individual set comprising one of said nozzles and one of said tubes;

said nozzle moving unit comprising:

a plurality of arm swing supports each individually pivotally supporting said support arms, respectively, an arm selecting and moving device for moving a selected one of said arm swing supports to a predetermined position located outboard of a substrate to which said apparatus is to supply a treating liquid, aligning and engaging means for engaging a selected swing arm support moved to said predetermined position by said arm selecting and moving means, to render said selected swing arm support and said support arm supported thereby pivotable about a pivot axis P displaced horizontally from said nozzles, and an arm swing for engaging and swinging said selected support arm aligned by said aligning and engaging means, to move the nozzle supported by said selected support arm between said dispensing position and a standby position displaced outboard of a substrate to which treating liquid is to be applied.

4. Apparatus as defined in claim 3, wherein said arm selecting and moving device comprises:

a movable frame for vertically movably supporting said arm swing supports juxtaposed in a row;

a relatively stationary frame for supporting said movable along a guide rail of said relatively fixed frame; and a movable frame drive for driving said movable frame horizontally.

5. Apparatus as defined in claim 4, wherein said aligning and engaging means comprises:

a drive member vertically movable relative to said selected support arm; and engaging formations for interconnecting said selected support arm and said drive member.

6. Apparatus as defined in claim 5, wherein said arm swing means comprising:

lift means for vertically moving said selected support arm aligned and engaged by said aligning and engaging means, between an engaged position and a position above said engaged position;

a drive member for swinging said selected support arm as rigidly connected thereto; and drive member driving means for driving said drive member.

7. Apparatus as defined in claim 6, further comprising a contact member for contacting said selected arm swing support to clamp said selected support arm with said drive member.

8. Apparatus as defined in claim 4, wherein said arm swing means comprises:

lift means for vertically moving said selected support arm aligned and engaged by said aligning and engaging formations, between an engaged position and a position above said engaged position;

a drive member for swinging said selected support arm as rigidly connected thereto; and drive member driving means for driving said drive member.

9. Apparatus as defined in claim 3, wherein said aligning and engaging means comprises:

a drive member vertically movable relative to said selected support arm; and engaging formations for interconnecting said selected support arm and said drive member.

10. Apparatus as defined in claim 9, wherein said arm swing means comprises:

lift means for vertically moving said selected support arm aligned and engaged by said aligning and engaging formations, between an engaged position and a position above said engaged position;

a drive member for swinging said selected support arm as rigidly connected thereto; and drive member driving means for driving said drive member.

11. Apparatus as defined in claim 3, wherein said arm swing means comprises:

lift means for vertically moving said selected support arm aligned and engaged by said aligning and engaging formations, between an engaged position and a position above said engaged position;

a drive member for swinging said selected support arm as rigidly connected thereto; and drive member driving means for driving said drive member.

12. Apparatus for applying treating liquid to a substrate which is supported for a spinning motion by substrate spin treating apparatus comprising:

a plurality of nozzles each for supplying a treating liquid to a substrate supported for a spinning motion;

a plurality of tubes each for connecting an individual one of said nozzles to a supply of treating liquid;

temperature control piping for contacting said tubes to maintain treating liquids in said tubes at a constant temperature; and a common nozzle moving device for selecting and moving each of the nozzles one at a time to a dispensing position aligned above substrate for dispensing a treating liquid thereon;

a plurality of rigid support arms each of which supports an individual set comprising one of said nozzles and one of said tubes;

said common nozzle moving device comprising:

a plurality of arm swing supports each of which supports an individual one of said support arms for pivotable motion about different predetermined pivotal axes located outboard of a substrate positioned for treatment by said apparatus;

arm selecting means movable from one of said support arms to another to engage a selected support arm; and an arm swing for drivingly engaging and swinging said selected support arm engaged by said arm selecting means in a position outboard of a substrate positioned for treatment, to move the nozzle supported by said selected support arm between said dispensing position and a standby position outboard of a substrate positioned for treatment.

13. Apparatus as defined in claim 12, wherein each of said support arms is pivotable about one of said pivotal axes which extend vertically, such that a length from said one of said pivotal axes to the nozzle, in plan view, equals a distance between said one of said pivotal axes and a spin axis of a substrate positioned for treatment, said apparatus further comprising a drive member pivotable about a vertical axis displaced from said pivotal axes, said arm selecting means being operable for horizontally advancing and retracting said drive member to selectively engage said support arms.

14. Apparatus as defined in claim 13, further comprising drive member driving means for causing said drive member to engage and support said selected support arm for vertical movement and for driving said drive member vertically.

15. Apparatus as defined in claim 12, wherein there is a lost motion connection between said arm swing and the selected support arm drivingly engaged therewith.

* * * * *